(12) United States Patent
Igarashi et al.

(10) Patent No.: US 6,664,138 B2
(45) Date of Patent: Dec. 16, 2003

(54) METHOD FOR FABRICATING A CIRCUIT DEVICE

(75) Inventors: Yusuke Igarashi, Gunma (JP); Noriaki Sakamoto, Gunma (JP); Yoshiyuki Kobayashi, Gunma (JP); Takeshi Nakamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 1 day.

(21) Appl. No.: 10/172,419

(22) Filed: Jun. 14, 2002

(65) Prior Publication Data

US 2002/0192875 A1 Dec. 19, 2002

(30) Foreign Application Priority Data

Jun. 19, 2001 (JP) .................................... P. 2001-185424

(51) Int. Cl.⁷ ................................................ H01L 21/50
(52) U.S. Cl. .................. 438/126; 438/107; 438/127; 257/773; 257/778
(58) Field of Search ................................ 438/126, 127, 438/107; 257/773, 778

(56) References Cited

U.S. PATENT DOCUMENTS 5,832,600 A * 11/1998 Hashimoto .................... 29/841
6,222,272 B1 * 4/2001 Takayama et al. .......... 257/773

* cited by examiner

Primary Examiner—David Nelms
Assistant Examiner—Reneé R. Berry
(74) Attorney, Agent, or Firm—Fish & Richardson P.C.

(57) ABSTRACT

A method for fabricating a circuit device is provided. An insulation resin sheet having the first conductive layer 3 and the second conductive layer 4 adhered to each other by insulation resin 2 is used, the first conductive path layer 5 is formed by the first conductive layer 3, and semiconductor elements 7 are adhered to and fixed on overcoating resin 8 that covers the first conductive path layer 5, thereby freely routing the first conductive path layer 5 having fine patterns below the semiconductor elements 7. Furthermore, the second conductive layer 4 that has been formed to be thick is removed after a package is sealed with a sealing resin layer 13, and external electrodes 14 are formed in through holes of the insulation resin 2.

16 Claims, 6 Drawing Sheets

METHOD FOR FABRICATING A CIRCUIT DEVICE

BACKGROUND OF THE INVENTION

1. Field of the Invention

The present invention relates to a method for fabricating a circuit device, and in particular, a method for fabricating a circuit device, which is able to achieve thinning of the circuit device using two sheets of conductive layer.

2. Description of the Prior Arts

Recently, IC packages have been actively employed in portable devices, and small-sized and high density assembly devices. Conventional IC packages and assembly concepts tend to greatly change. For example, this is described in, for example, Japanese Laid-Open Patent Publication No. 2000-133678. This pertains to a technology regarding a semiconductor apparatus in which a polyimide resin sheet being a flexible sheet is employed as one example of insulation resin sheets.

FIG. 9 through FIGS. 11A, 11B and 11C show a case where a flexible sheet 50 is employed as an interposer substrate. Also, the views illustrated upside of the respective drawings are plan views, and the views illustrated downside thereof are longitudinally sectional views taken along the lines A—A of the respective drawings.

First, copper foil patterns 51 are prepared to be adhered to each other via an adhesive resin on the flexible sheet 50 illustrated in FIG. 9. These copper foil patterns 51 have different patterns, depending upon cases where a semiconductor element to be assembled is a transistor or an IC. Generally speaking, a bonding pad 51A and an island 51B are formed. Also, an opening 52 is provided to take out an electrode from the rear side of the flexible sheet 50, from which the above-described copper foil pattern 51 is exposed.

Subsequently, the flexible sheet 50 is transferred onto a die bonder, and as shown in FIG. 10, a semiconductor element 53 is assembled or mounted. After that, the flexible sheet 50 is transferred onto a wire bonder, wherein the bonding pads 51A are electrically connected to the pads of the semiconductor elements 53 by thin metal wires 54.

Finally, as shown in FIG. 11A, sealing resin 55 is provided on the surface of the flexible sheet 50, and the surface thereof is completely sealed with the sealing resin 55. Herein, the bonding pads 51A, island 51B, semiconductor elements 53 and thin metal wires 54 are transfer-molded so as to be completely overcoated.

After that, as shown in FIG. 11B, connecting means 56 such as solder and a soldering ball is provided, wherein spherical solder 56 deposited to the bonding pad 51A is formed via the opening 52 by passing through a solder reflow furnace. Further, since semiconductor elements 53 are formed in the form of a matrix on the flexible sheet 50, these are diced to be separated from each other as shown in FIG. 11.

In addition, the sectional view of FIG. 11C shows electrodes 51A and 51D on both sides of the flexible sheet 50 as the electrodes. The flexible sheet 50 is generally supplied from a maker after both sides thereof are patterned.

In prior art methods for fabricating circuit devices, a flexible sheet 50 is transferred in the above-described fabrication apparatus, for example, a die bonder, a wire bonder, a transfer molding apparatus, a reflow furnace, etc., and is mounted on a portion called a "stage" or a "table".

The thickness of insulation resin, which becomes the base of a flexible sheet 50, is made thin at approx. 50 $\mu$m, and where the thickness of a copper foil pattern 51 formed on the surface thereof is thin at 9 through 35 $\mu$m, there is a shortcoming by which the insulation resin is warped as shown in FIG. 12 to cause its transfer performance to be worsened, and mountability thereof on the above-described stage or table is also worsened. It is considered that this is because the insulation resin itself is thin to be warped, and warping occurs due to a difference in the thermal expansion coefficient between the copper foil pattern 51 and the insulation resin. In particular, there is another problem in that, if a hard insulation material not using any core material of glass cloth fibers is warped as shown in FIG. 12, the insulation material is easily collapsed by compression from above.

Since the portion of the opening 52 is compressed from above when being molded, a force by which the periphery of the bonding pad 51A is warped upward is brought about, the adhesion of the bonding pad 51A is worsened.

Also, the resin material that constitutes a flexible sheet 50 has less flexibility, or if a filler to increase the thermal conductivity is blended, the flexible sheet 50 is made hard. In such a case, where bonding is carried out by a wire bonder, there may be a case where the bonded portion is cracked. Also, when performing transfer molding, there is a case where the portion with which a metal die is brought into contact is cracked. This remarkably occurs if any warping shown in FIG. 12 is provided.

Although the flexible sheet 50 described above is such a type that no electrode is formed on the rear side thereof, there are cases where an electrode 51D is formed on the rear side of the flexible sheet 50 as shown in FIG. 11C. At this time, since the electrode 51D is brought into contact with the above-described fabrication apparatus or is brought into contact with the transfer plane of transfer means between the fabrication apparatuses, another problem occurs in that damage and scratches arise on the rear side of the electrode 51D, wherein the electrode is established with such damage and scratches retained, the electrode 51 itself may be cracked due to application of heat later on.

Also, if an electrode 51D is provided on the rear side of the flexible sheet 50, a problem occurs in that, when carrying out transfer molding, no facial contact with the stage can be secured. In this case, if the flexible sheet 50 is composed of a hard material as described above, the electrode 51D becomes a fulcrum and the periphery of the electrode 51D is compressed downward, wherein the flexible sheet 50 is cracked.

SUMMARY OF THE INVENTION

A method for fabricating a circuit device according to the invention is comprised of the steps of: preparing an insulation resin sheet having a first conductive layer and a second conductive layer adhered together by insulation resin; forming a conductive path layer by etching the above-described first conductive layer to an appointed pattern; adhering and fixing semiconductor elements on the above-described conductive path layer with the same electrically insulated therefrom; overcoating the above-described conductive path layer and the above-described semiconductor elements with a sealing resin layer; removing the above-described second conductive layer by etching the same; and providing through holes in the above-described insulation resin that covers the rear side of the above-described conductive path layer, and forming external electrodes on the above-described conductive path layer, whereby the above-described problems can be solved.

Since the flexible sheet is formed to be thick by the first conductive layer and the second conductive layer, flatness of a sheet-like circuit device can be maintained even if the insulation resin is thin.

Also, mechanical strength is retained by the second conductive layer until the step of overcoating the first conductive path layer and semiconductor elements with a sealing resin layer is finished, and the sealing resin layer retains the mechanical strength thereafter. Therefore, the second conductive layer can be easily removed. As a result, the insulation resin does not require any mechanical strength, wherein the insulation resin can be made sufficiently thin to retain only an electrical insulation property.

Further, since the lower die mold and planes of a transfer molding apparatus are brought into contact with the entirety of the second conductive layer, no local compression is brought about, and it is possible to prevent the insulation resin from being cracked.

The method according to the invention has the following advantages.

First, warping of an insulation resin sheet can be prevented by the second conductive layer until a substrate is molded by a sealing resin layer, and transfer performance thereof can be improved.

Second, since the second conductive layer can retain mechanical support of the insulation resin sheet until the sealing resin layer is formed, and the sealing resin layer can subsequently retain mechanical support of the insulation resin sheet after the second conductive path layer is formed, the mechanical strength of the insulation resin is disregarded, wherein a remarkably thin assembly method can be achieved.

Third, since both sides of the insulation resin are covered with the first and second conductive layer in cases where the insulation resin itself is hard or becomes hard by blending of a filler, the flatness of the insulation resin sheet itself can be improved, wherein it is possible to prevent cracks from occurring.

Fourth, since the rear side of the insulation resin sheet has the second conductive layer thickly formed, the insulation resin sheet can be used as a supporting substrate for die bonding of chips and for sealing a wire bonder and semiconductor elements. Further, even where the insulation resin material is soft, propagation of energy in wire bonding can be improved, wherein the wire bondability can be accordingly improved.

Fifth, since the conductive path layer can be finely patterned and can be freely routed below the semiconductor elements, path density which is equivalent to multi-layer connection can be realized in a single layer although so-called multi-layer connection is not enabled. In addition, overcoating on the surface where external electrodes are formed can be abolished, and no plating process is required, wherein a remarkably cheap and simplified fabrication process can be achieved.

DESCRIPTION OF THE PREFERRED EMBODIMENTS

A description is given of a method for fabricating a circuit device according to the invention with reference to FIG. 1 through FIG. 8.

The method for fabricating a circuit device according to the invention includes the steps of: preparing an insulation resin sheet having a first conductive layer and a second conductive layer adhered together by insulation resin; forming a conductive path layer by etching the above-described first conductive layer to an appointed pattern; adhering and fixing semiconductor elements on the above-described conductive path layer with the same electrically insulated therefrom; overcoating the above-described conductive path layer and the above-described semiconductor elements with a sealing resin layer; removing the above-described second conductive layer by etching the same; and providing through holes in the above-described insulation resin that covers the rear side of the above-described conductive path layer, and forming external electrodes on the above-described conductive path layer.

Figure 1:
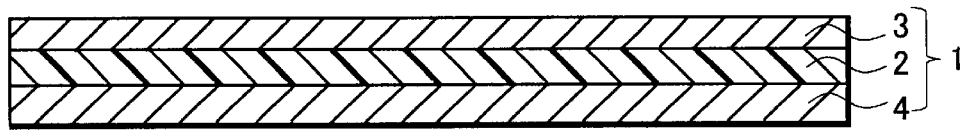
FIG. 1 is a sectional view describing a method for fabricating a circuit device according to the invention.

As shown in FIG. 1, the first step according to the invention prepares an insulation resin sheet 1 having the first conductive layer 3 and the second conductive layer 4 adhered together by the insulation resin 2.

The first conductive layer 3 is formed on substantially the entire surface of the insulation resin sheet 1, and the second conductive layer 4 is formed on substantially the entire rear side thereof. Also, the material of the insulation resin 2 is an insulation material made of macromolecules such as polyimide resin or epoxy resin, etc. In addition, the main material of the first conductive layer 3 and the second conductive layer 4 is preferably Cu or a material of publicly known lead frames, and the conductive layer may be coated on the insulation resin 2 by a plating method, a depositing method or a spattering method. Further, metal foil formed by a rolling method or a plating method may be adhered thereto.

Also, the insulation resin sheet 1 may be formed by a casting method. Hereinafter, a brief description is given of the fabrication method. First, paste-like polyimide resin is coated on the first conductive layer 3 that is a flat-film type, and paste-like polyimide resin is also coated on the second conductive layer 4 that is a flat-film type. And, both of these are adhered to each other after the polyimide resin is semi-hardened, whereby an insulation resin sheet 1 can be fabricated.

The invention is featured in that the second conductive layer 4 is made thicker than the first conductive layer 3.

The first conductive layer 3 is formed to be 5 through 35 $\mu$m thick, and is devised and made as thin as possible so that a fine pattern can be formed. The second conductive layer 4 may be 70 through 200 μm thick, wherein emphasis is placed on retaining its supporting strength.

Therefore, flatness of the insulation resin sheet 1 can be maintained by thickly forming the second conductive layer 4, and work efficiency can be improved in subsequent processes. It is possible to prevent the insulation resin 2 from being cracked and to prevent cracks from occurring.

Further, the second conductive layer 4 is damaged through various processes. However, it is possible to eliminate damage and scratches since the thick second conductive layer 4 is removed. Since the sealing resin is hardened while maintaining the flatness, the rear side of a package can be made flat, and the electrodes that are formed on the rear side of the insulation resin sheet 1 can be disposed to be flat. Therefore, an electrode of an assembly substrate and an electrode on the rear side of the insulation resin sheet 1 can be brought into contact with each other, wherein it is possible to prevent soldering from becoming defective.

Polyimide resin, epoxy resin, etc., are preferably used as the insulation resin 2. In the case of a casting method in which paste-like resin is coated to fabricate a sheet, the layer thickness is 10 through 100 μm. Also, in a case of forming the insulation resin 2 as a sheet, a sheet that is available on the market has a minimum thickness of 25 μm. Also, a filler may be blended therein in consideration of thermal conductivity. Glass, Si oxide, aluminum oxide, Al nitride, Si carbide, boron nitride, etc., are considered as materials of the filler. As described above, the insulation resin 2 may be selected from resin having low thermal resistance, or that having super low thermal resistance, in which the above-described filler is blended, or polyimide resin. These resins may be selectively used, depending upon the characteristics of a circuit device to be formed.

Figure 2:
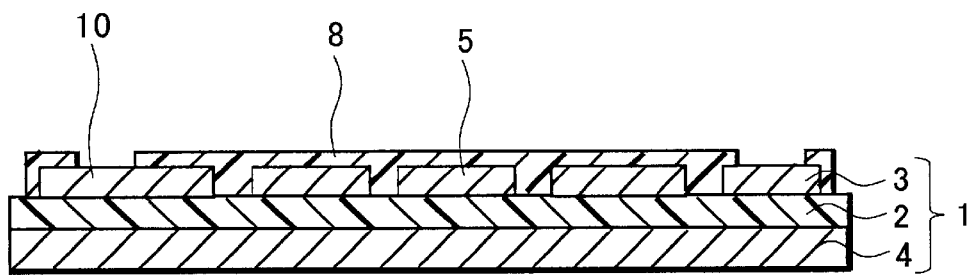
FIG. 2 is a sectional view describing a method for fabricating a circuit device according to the invention.
Figure 3:
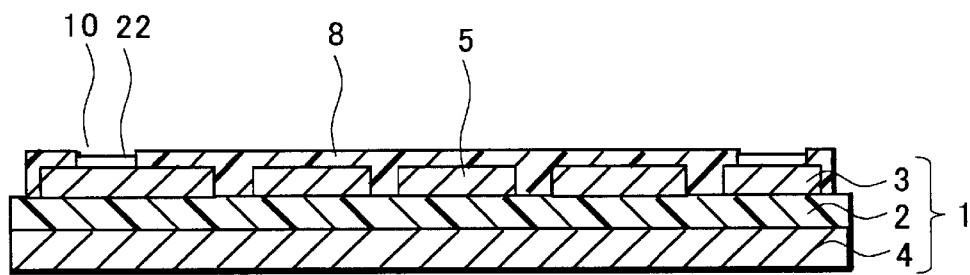
FIG. 3 is a sectional view describing a method for fabricating a circuit device according to the invention.

The second step according to the invention forms the first conductive path layer 5 by etching the first conductive layer to an appointed pattern as shown in FIG. 2 and FIG. 3.

The first conductive layer 3 is overcoated with photo-resist of an appointed pattern, and the bonding pads 10 and the first conductive path layer 5 extending from these bonding pads 10 to the center of a substrate are formed by chemical etching. Since the first conductive layer 3 is mainly composed of Cu, the etching solution of ferric chloride or cupric chloride may be used for the chemical etching.

Since the first conductive layer 3 is formed to be 5 through 35 μm or so, the first conductive path layer 5 may be formed to be a fine pattern which is smaller than 50 μm.

Continuously, the bonding pads 10 of the first conductive path layer 5 are exposed, and other portions are overcoated with overcoating resin 8. The overcoating resin 8 is such that epoxy resin, etc., is dissolved with a solvent and is adhered by a screen printing method, and is thermally hardened.

As shown in FIG. 3, a plated layer 22 of Au, Ag, etc., is formed on the bonding pads 10 in consideration of the bonding ability. The plated layer 22 is non-electrolytically plated selectively on the bonding pads 10 by using the overcoating resin 8 as a mask, or is adhered by electrolytical plating, using the second conductive layer 4 as an electrode.

Figure 4:
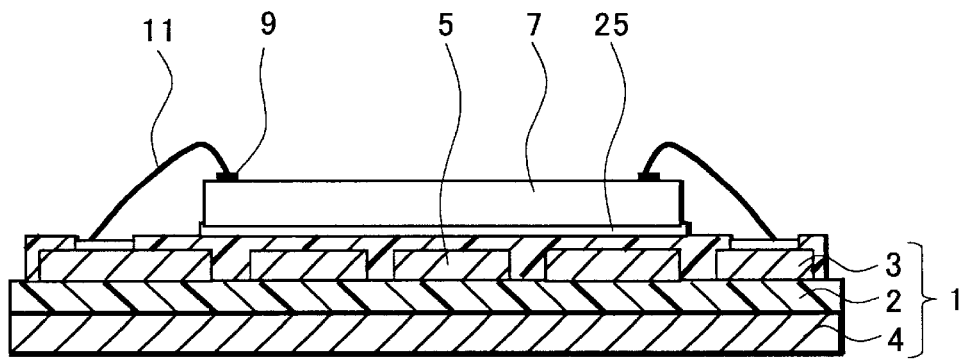
FIG. 4 is a sectional view describing a method for fabricating a circuit device according to the invention.

The third step according to the invention adheres and fixes a semiconductor element 7 on the conductive path layer 5 after being electrically insulated therefrom as shown in FIG. 4.

The semiconductor element 7 is die-bonded on the overcoating resin 8 by insulation adhesion resin 25 as it is a bare chip. Since the semiconductor element 7 is electrically insulated from the conductive path layer 5 immediately therebelow by the overcoating resin 8, the conductive path layer 5 can be freely routed below the semiconductor element 7.

Also, respective electrode pads 9 of the semiconductor element 7 are connected to the bonding pads 10, which are parts of the conductive path layer 5 secured at the periphery, by bonding wires 11. The semiconductor elements 7 may be assembled with the faces down. In this case, soldering balls and bumps are provided on the surface of the respective electrodes 9 of the semiconductor elements 7, and electrodes similar to the bonding pads 10 are provided at portions corresponding to the positions of the soldering balls on the surface of the insulation resin sheet 1.

A description is given of the advantages of using the insulation resin sheet 1 when bonding wires. Generally, when bonding Au wires, heating is carried out around 200 through 300° C. At this time, the insulation resin sheet 1 is warped if the second conductive layer 4 is thin. If the insulation resin sheet 1 is compressed via the bonding head in this state, there is a possibility for the insulation resin sheet 1 to be cracked. This remarkably occurs since, if a filler is blended in the insulation resin 2, the material itself becomes hard and flexibility is lost. Also, since resin is softer than metals, energy of compression and ultrasonic waves may be dispersed in the bonding of Au and Al. However, if the insulation resin 2 is made thin and the second conductive layer 4 is formed to be thick, these problems can be solved.

Figure 5:
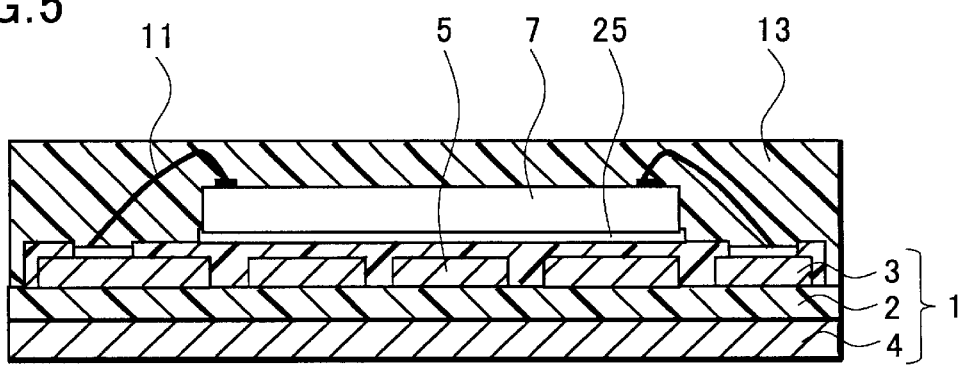
FIG. 5 is a sectional view describing a method for fabricating a circuit device according to the invention.

The fourth step according to the invention overcoats the conductive path layer 5 and the semiconductor element 7 with a sealing resin layer 13 as shown in FIG. 5.

The insulation resin sheet 1 is set in a molding apparatus and is used for resin molding. Transfer molding, injection molding, coating, dipping, etc., may be possible as the molding method. However, in consideration of mass production, the transfer molding and injection molding are favorable.

Although, in this step, it is necessary that the insulation resin sheet 1 is flatly brought into contact with the lower metal die of a mold cavity, the second conductive layer 4, which is thick, functions like this. In addition, until contraction of the sealing resin layer 13 is completely finished after the insulation resin sheet 1 is taken out from the mold cavity, the flatness of a package can be maintained by the second conductive layer 4.

That is, the role of the mechanical support of the insulation resin sheet 1 is retained by the second conductive layer 4.

Figure 6:
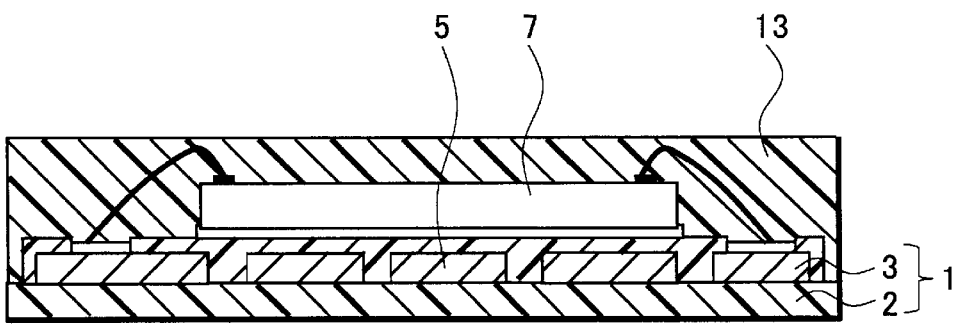
FIG. 6 is a sectional view describing a method for fabricating a circuit device according to the invention.

As shown in FIG. 6, the fifth step according to the invention removes the second conductive layer 4 by etching.

As shown in FIG. 6, the entire surface of the second conductive layer 4 is etched and removed without any mask. The etching may be chemical etching using ferric chloride or cupric chloride. Second conductive layer 4 is removed to cause the rear side of the insulation resin 2 to be exposed. At this time, damage and scratches brought about to the second conductive layer 4 in the preceding processes can be removed.

Figure 7:
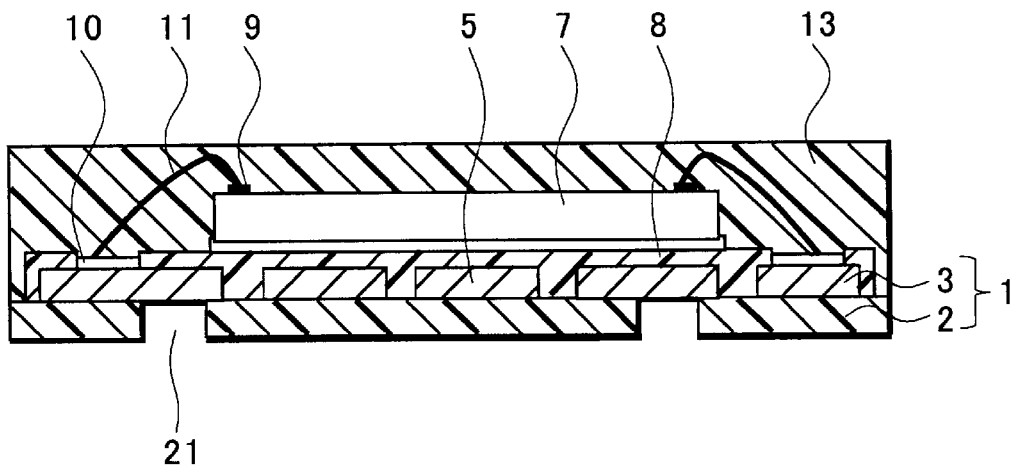
FIG. 7 is a sectional view describing a method for fabricating a circuit device according to the invention.
Figure 8:
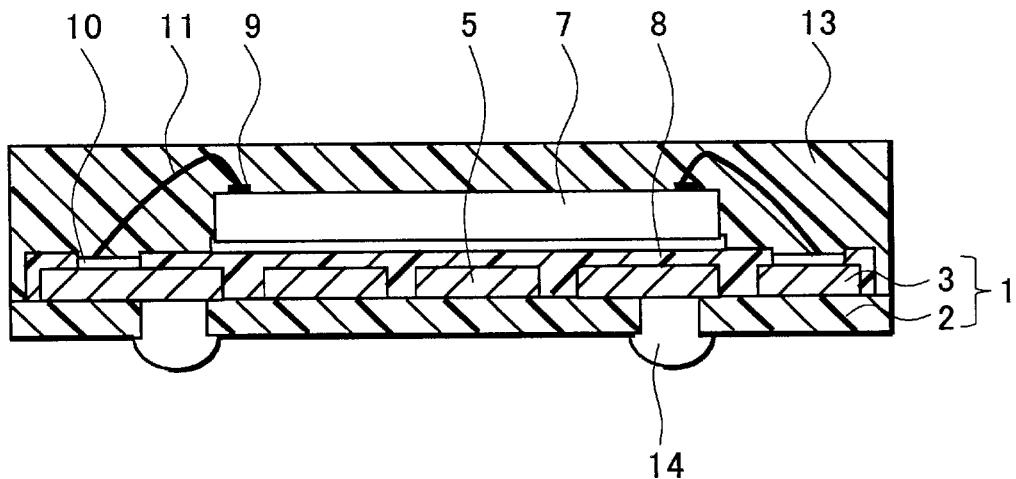
FIG. 8 is a sectional view describing a method for fabricating a circuit device according to the invention.
Figure 9:
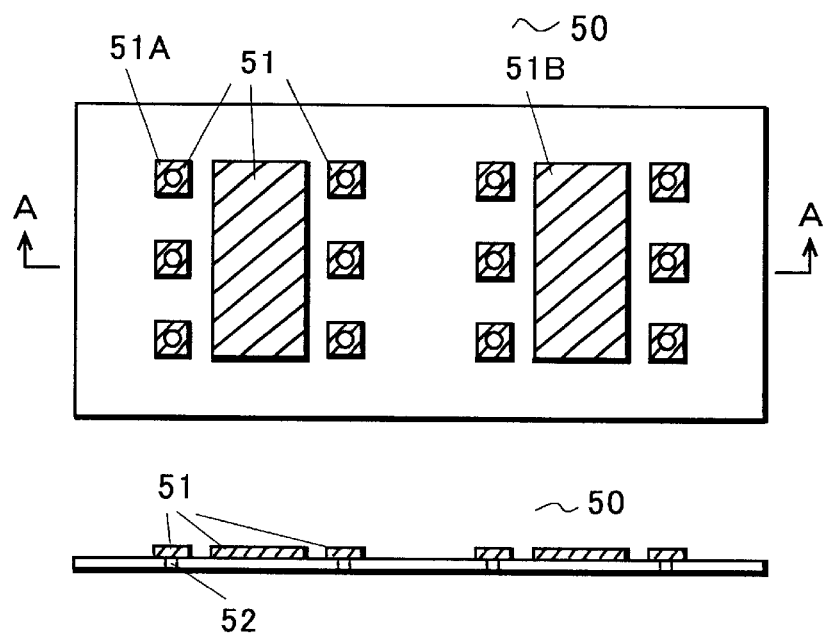
FIG. 9 is a view describing a method for fabricating a semiconductor according to prior arts.
Figure 10:
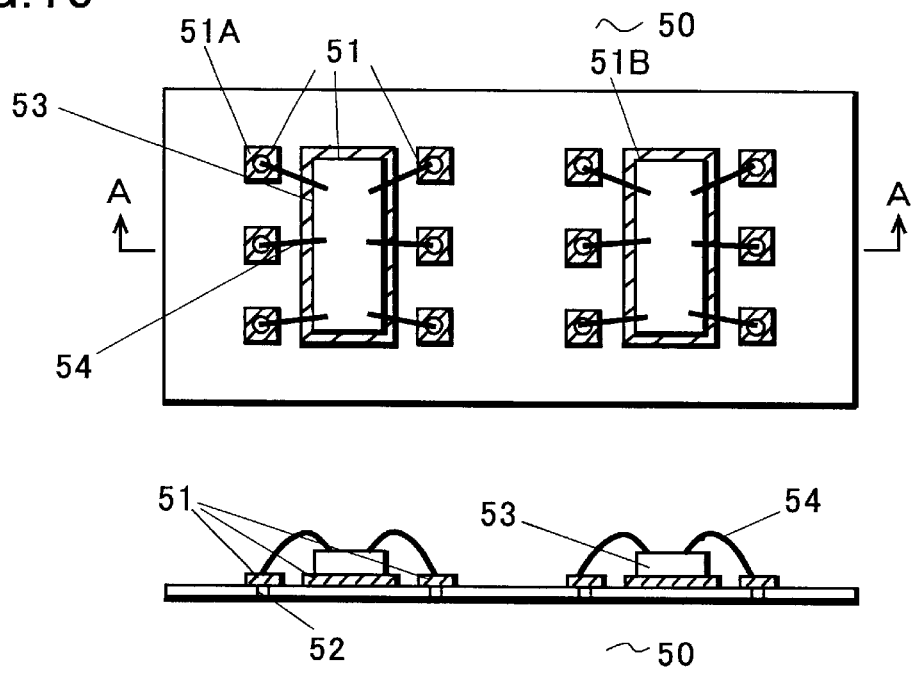
FIG. 10 is a view describing a method for fabricating a semiconductor according to prior arts.
Figure 11A:
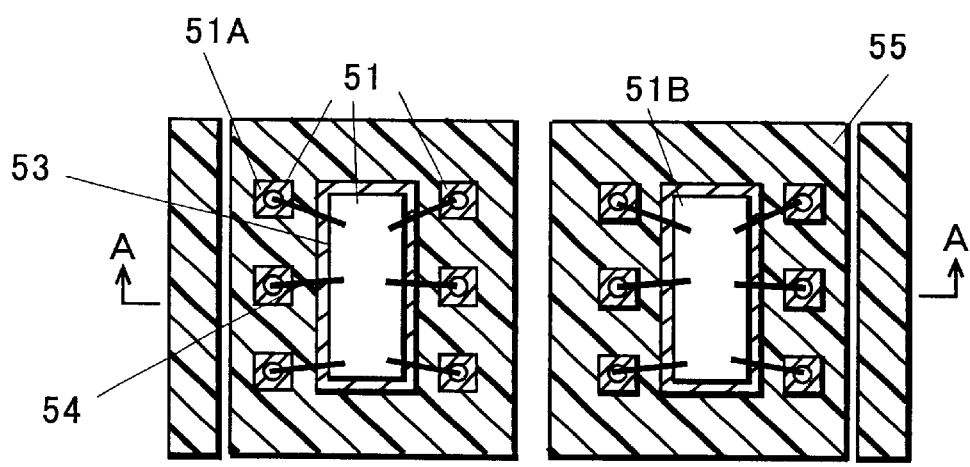
FIGS. 11A, 11B and 11C are views describing a method for fabricating a semiconductor according to prior arts.
Figure 11B:
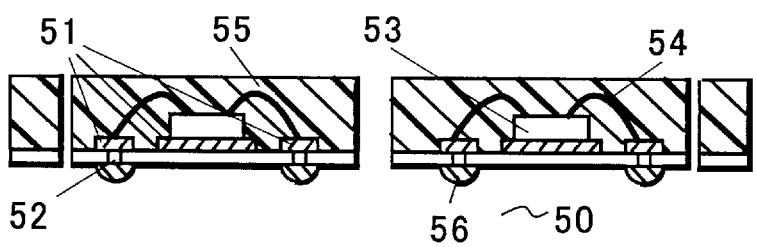
Figure 11C:
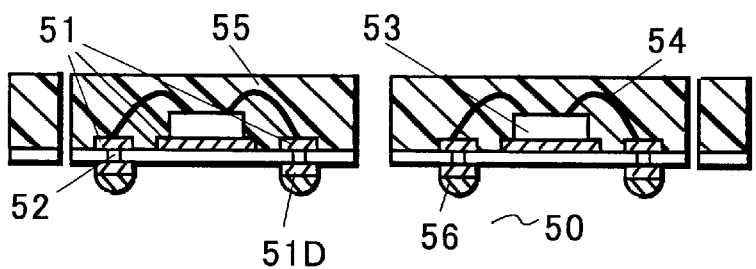
Figure 12:
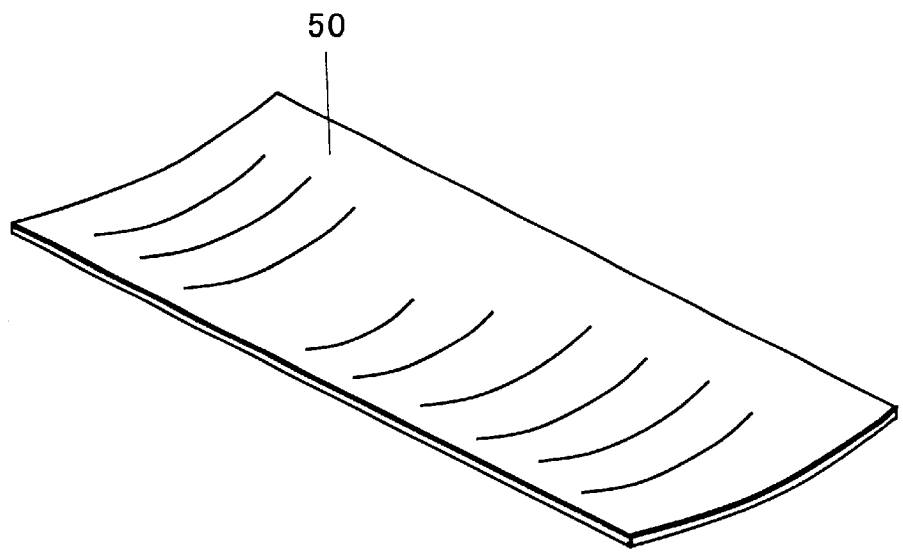
FIG. 12 is a view describing a prior art flexible sheet.

As shown in FIG. 7, the sixth step according to the invention provides through holes 21 in the insulation resin 2 that covers the rear side of the conductive path layer 5 and forms external electrodes 14 on the conductive path layer 5.

The insulation resin 2 is overcoated with photo-resist with only portions exposed where the through holes 21 are formed. Continuously, the insulation resin 2 is removed by laser, using the photo-resist as a mask, to expose the rear side of the conductive path layer 5 to the bottoms of the through holes 21. The laser is preferably a carbonic acid gas laser. Where residue remains on the bottom of the opening portion after the insulation resin is evaporated by a laser, wet etching is carried out by permanganic soda or persulfuric ammonium in order to remove the residue.

Next, external electrodes 14 are simultaneously formed at the exposed portions by reflowing of solder or screen printing of solder cream.

Finally, since a number of circuit devices are formed on the insulation resin sheet 1 in the form of matrices, the sealing resin layer 13 and insulation resin sheet 1 are diced and are separated for individual circuit devices.

What is claimed is:

1. A method for fabricating a circuit device, comprising:
   providing a first conductive layer disposed over a second conductive layer and adhered together by insulation resin;
   etching said first conductive layer to form a conductive path layer;
   fixing semiconductor elements on said conductive path layer;
   coating said conductive path layer and said semiconductor elements with a sealing resin layer;
   removing said second conductive layer by etching to expose said insulation resin; and
   providing holes in said insulation resin; and
   forming external electrodes on said conductive path layer through the holes.

2. The method for fabricating a circuit device according to claim 1, wherein said first conductive layer and said second conductive layer are formed of copper foil.

3. The method for fabricating a circuit device according to claim 1, wherein said first conductive layer is formed to be thinner than said second conductive layer, and said conductive path layer is finely patterned.

4. The method for fabricating a circuit device according to claim 1, wherein said second conductive layer is formed to be thicker than said first conductive layer, and said second conductive layer retains mechanical support of said first conductive layer until coating the same with said sealing resin layer is finished.

5. The method for fabricating a circuit device according to claim 1, wherein said first conductive layer is mechanically supported by said sealing resin layer after coating the same with said sealing resin layer.

6. The method for fabricating a circuit device according to claim 1, wherein said holes are formed by laser etching of said insulation resin.

7. The method for fabricating a circuit device according to claim 6, wherein said laser etching utilizes a carbonic acid gas laser.

8. The method for fabricating a circuit device according to claim 1, wherein said first conductive path layer is coated with resin with selected portions thereof not coated after said conductive path layer is formed.

9. The method for fabricating a circuit device according to claim 1, wherein a layer plated by gold or silver is formed at portions exposed from said coating resin of said conductive path layer.

10. The method for fabricating a circuit device according to claim 8, wherein said semiconductor elements are adhered to and fixed on said coating resin.

11. The method for fabricating a circuit device according to claim 10, wherein electrodes of said semiconductor elements and said gold- or silver-plated layer are connected to each other by bonding wires.

12. The method for fabricating a circuit device according to claim 1, wherein said sealing resin layer is formed by a transfer mold.

13. The method for fabricating a circuit device according to claim 1, wherein said second conductive layer is removed by etching the same without any mask.

14. The method for fabricating a circuit device according to claim 1, wherein said through holes are provided on the rear side of said appointed conductive path layer.

15. The method for fabricating a circuit device according to claim 1, wherein said external electrodes have solder adhered thereto by screen printing of solder and are formed by being heated and dissolved.

16. The method for fabricating a circuit device according to claim 1, wherein said external electrodes are formed by reflowing of solder.

* * * * *